United States Patent Office 3,518,115

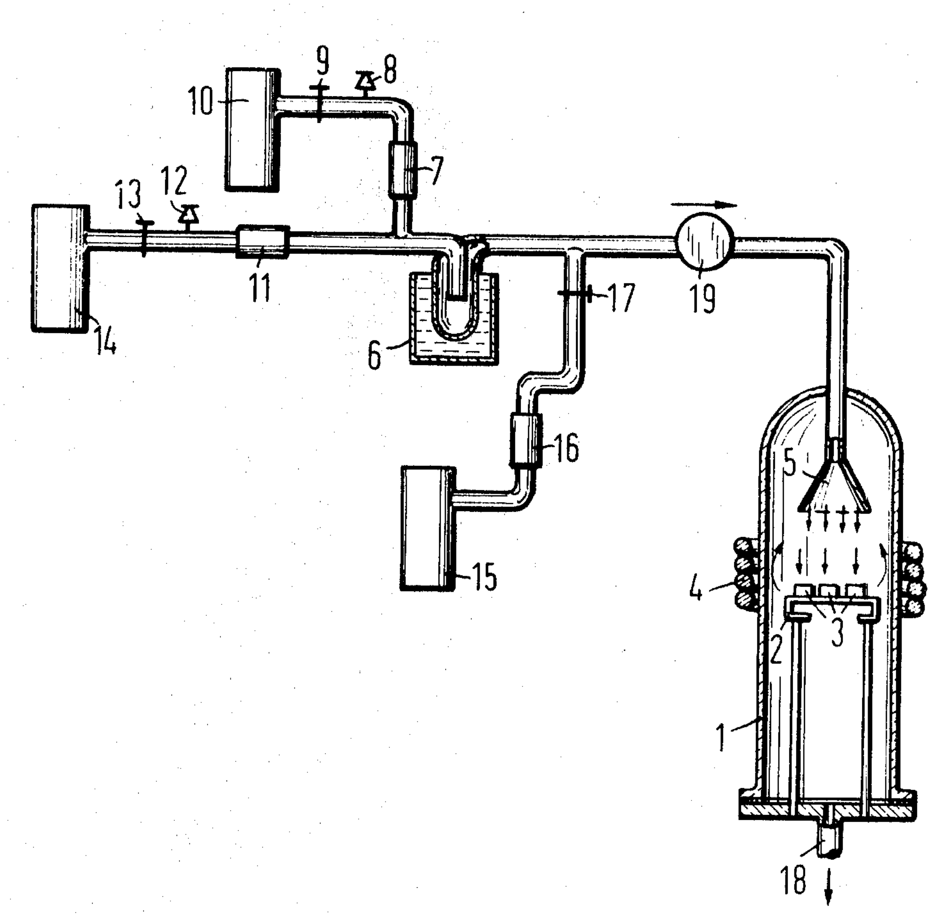
10
9
8
7
13
12
11
14
6
17
19
16
15
5
4
3
2
1
18

Patented June 30, 1970

3,518,115
METHOD OF PRODUCING HOMOGENEOUS OXIDE LAYERS ON SEMICONDUCTOR CRYSTALS

Erich Pammer and Eduard Folkmann, Munich, Germany, assignors to Siemens Aktiengesellschaft, a corporation of Germany Filed June 30, 1966, Ser. No. 562,003
Claims priority, application Germany, July 5, 1965, S 97,992
Int. Cl. H01b 3/10
U.S. Cl. 117—213 4 Claims

ABSTRACT OF THE DISCLOSURE

Described is a method of producing homogeneous oxide layers on semiconductor crystals, particularly silicon semiconductor crystals, at elevated temperatures. The method comprises oxidizing the semiconductor crystal with $CO_2$ in conjunction with a hydrogen-containing compound as a catalyst transported by a carrier gas during the oxidation.

In the manufacture of planar semiconductor devices, semiconductor crystals are provided with oxide layers. These layers should be as homogeneous as possible and very even with respect to their thickness. The oxide layers, on the surface of semiconductor crystals, are used to limit the indiffusion of doping elements to localities from which said oxide layers were removed by means of the known photo-resist technique. Furthermore, the oxide layers should be as free as possible from impurities which would adversely influence ensuing diffusion processes for the production of p-n junctions. A good surface adhesion is also necessary.

As a rule, such oxide layers are produced through oxidation in a moist oxygen or pure water-vapor (steam) atmosphere, at temperatures of 1000–1200° C. The base material is a highly purified semiconductor crystal wafer, approximately 0.3 mm. thick, of any conductivity or conductance type, and polished or lapped. It is desirable, immediately after producing the semiconductor crystal, for example by epitaxy, and removing disturbed surfaces therefrom by an etching process, to grow the oxide layer on the crystal surface thereby avoiding lengthy and expensive etching and purifying processes preparatory to oxidation.

Present day methods do not permit oxidation of the silicon surface immediately after epitactic growth or the removal of disturbed surface layers through gaseous phase etching. When using oxygen-containing gases, a lengthy, intermediary rinsing with inert gas is necessary in order to avoid explosions. When using water vapor containing gases, even after prolonged rinsing, one can hardly avoid a reaction with silicon-halide residues still present in the gas chamber or adsorbed by the apparatus walls. The solid hydrolysis products of such reaction, mainly silicic acid, flow along with the gas current as a fine dust and settle upon the blank silicon surfaces. It is impossible to produce an undisturbed oxide layer on such surfaces. Even a lengthy intermediary rinsing with inert gas leads to a variable adsorbing on the silicon surface, through saturation of the free valences of the fresh silicon surface, of impurities in the inert gas or of the inert gas itself. This may easily result in disturbances of a homogeneous oxide growth.

In actual practice, therefore, the oxidation is generally effected in a separate installation. For reasons stated above, it is necessary that the silicon discs again be chemically cleaned prior to inserting into the oxidation apparatus. The complications associated with this two step method are well known.

From thermo-dynamic considerations, $CO_2$ and silicon should react smoothly with formation of $SiO_2$ and CO:

$$2CO_2+Si=SiO_2+2CO$$

Tests conducted with monocrystalline silicon, however, show that $CO_2$ at 1200° C. silicon does not noticeably oxidize. By adding $H_2$, however, we overcome this reaction obstacle. The oxide layers formed are completely without fault:

$$2CO_2+2H_2=2CO+2H_2O$$
$$2H_2O+Si=SiO_2+2H_2$$

$$2CO_2+Si=SiO_2+2CO$$

Hydrogen, which according to the first equation reacts with $CO_2$ to form CO and $H_2O$, acts as a genuine catalyst, since, according to the second equation, it is reconverted during the silicon oxidation. Thus, hydrogen is not present in the overall equation.

Thus, our invention has as an object a method wherein, homogeneous oxide layers on semiconductor crystals of desired conductivity or conductance type, especially homogeneous silicon oxide layers on silicon semiconductor crystals, are produced through oxidation of the semiconductor crystal surface with $CO_2$ or a $CO_2$-separating material, in the presence of a catalyst. The catalyst is preferably hydrogen, although a hydrogen-containing compound is also suitable. The oxidation of the semiconductor crystal surface is effected at increased temperatures by appropriate heating.

Contrary to methods previously practiced, the method of this invention permits oxidation of the silicon after the epitactic growth method, or after silicon removal through a gaseous phase, or after a diffusion process. It is neither necessary to change the apparatus, nor to carry out the cumbersome intermediary rinsing, since no gas-forming materials are present nor materials hydrolyzing outside of the high temperature zone.

This immediate oxidation of the freshly formed or freshly removed silicon surface, which therefore is absolutely clean and disturbance free, results in a particularly homogeneous and non-porous $SiO_2$, such an $SiO_2$ is eminently suited for planar technique. Semiconductor structural components of the planar technique, which were oxidized in this manner, show a higher total yield, better biasing qualities and higher stability than the structural components produced according to the conventional methods.

In place of elemental hydrogen, volatile materials, containing bound hydrogen, such as hydrocarbons, e.g. methane or ethylene may be used. These also convert at high temperatures with $CO_2$ to form CO and $H_2O$ and thereby catalyze the silicon oxidation:

$$3CO_2+CH_4=4CO+2H_2O$$
$$Si+2H_2O=SiO_2+2H_2$$

$$3CO_2+CH_4+Si=4CO+2H_2+SiO_2$$

Likewise, bound $CO_2$ may be present in the volatile substance, as for example in formaldehyde and/or dimethylether:

$$2CH_2O=CO_2+CH_4$$
$$2C_2H_6O=CO_2+CH_4+C_2H_6+H_2$$

It is prerequisite, however, that the substances used during the preceding method step, for example, epitaxy, do not hydrolyze at room temperature.

The method according to the invention can also be carried out using hydrogen-containing, volatile nitrogen compounds, as for example ammonia or hydrazine. The carrier gas, for $CO_2$ or the above substances, is preferably an inert gas, for example argon.

If the main gas used is hydrogen, as for example in the HCl-gaseous phase etching, then hydrogen may also function as the carrier gas for $CO_2$ or the $CO_2$-containing compound and simultaneously as a catalyst. The changeover from etching to oxidation takes place simply by substituting $CO_2$ for HCl in the gas stream.

We find it especially favorable if the carrier gas, together with the admixtures, flows turbulently around the semiconductor crystal during the growth of the oxide layer. This turbulent flow can easily be achieved by installing mechanical devices into the gas supply, for example a shower above the semiconductor, in the reaction chamber, or a pulsator into the gas supply.

The oxidation of the semiconductor crystal surface may be executed in a closed reaction chamber, under increased pressure, or in an open reaction chamber which is passed by gas.

An additional advantage of this invention is that the reaction gas, for initiating the oxidation process, is at low temperatures, a dry, nonoxidizing gas which contributes to the oxidation of the semiconductor crystal only in the high temperature zone of the reaction chamber, preferably at 1200° C. Thus, one can provide a semiconductor crystal surface, highly purified for example by means of gaseous phase etching, with an adherent homogeneous silicon dioxide layer of defined thickness, without the necessity of changing the apparatus and without any intermediary rinsing. The method is very suitable for the production of semiconductor devices, particularly of silicon planar transistors, diodes, and integrated circuits, especially where high requirements are placed on stable, electrical characteristics. The invention provides the conditions necessary to produce uniform doping profiles through homogeneous and defined oxide layers on the crystal surface. This invention may be applied in the same favorable way for the production of semiconductor structural components wherein the p-n junctions, exposed through gaseous phase etching, are provided with a protective oxide layer to stabilize their characteristic data. An example of this are semiconductor structural components with mesa structures.

The drawing shall be referred to in the description of an embodiment example. In the drawing, reaction chamber 1 comprises a quartz tube, wherein arranged on a quartz carrier 2, the silicon semiconductor crystal discs 3 are to undergo gaseous phase etching and subsequent oxidation. The reaction chamber 1 is brought to reaction temperature through inductive heating means 4. A mechanical device built into the reaction gas supply, for example a shower 5 provided with a plurality of openings, together with the pulsator 19, produces a turbulent flow around the silicon discs, with the reaction mixtures, as indicated in the figure by arrows. During the gaseous phase etching, the hydrogen halide gas or vapor, e.g. hydrogen chloride gas, HCl, flows from container 10 and the carrier gas, for example hydrogen, $H_2$, flows from container 14, when valves 9 and 13 are respectively open, through the flow meters 7 and 11. Pressure safety valve vents 8 and 12 are in the line. The gas streams unite and the gas mixture flows through the cooling trap 6 for drying the gases. The dried gases flow through the shower 5, into the reaction chamber 1, where they remove at a reaction temperature of approximately 900° C., the surface layers up to a desired layer thickness. Thus the surface layers of the silicon crystal discs disturbed through impurities and mechanical influences are removed. Valve 17 is closed during this operation.

Thereafter, valve 9 is closed curtailing the supply of hydrogen halide so that the reaction chamber now is filled only with pure carrier gas, for example hydrogen or inert gas. Oxidation is then initiated by opening valve 17 whereby carbon dioxide is added to the carrier gas, from vessel 15, via flow meter 16. The temperature in the reaction chamber is brought to about 1200° C. A homogeneous oxide layer forms on the fresh silicon surface produced by the gaseous phase etching. The thickness of the oxide layer depends on the time and the flow velocity of the reaction gas. For example, after an oxidation reaction lasting one hour, with a ratio of $CO_2:H_2$ to 1:1, a flow velocity of 10 l./min. and a temperature of approximately 1200° C., a silicon dioxide layer of about 0.6 $\mu$ thickness is obtained.

The arrows in the figure indicate the flow direction of the reaction gases. At opening 18, the waste gases leave the reaction chamber.

It is also possible to use the method, according to the invention, to produce a homogeneous oxide layer after an epitactic precipitation of silicon upon a carrier body of semiconductor material. A volatile semiconductor compound, for example silicochloroform or silicon tetrachloride, in lieu of the carrier gas and hydrogen halide used for gaseous phase etching, is introduced into the reaction chamber together with excess hydrogen. After the desired thickness of the epitactic layer is obtained, the flow of semiconductor compound is discontinued by closing a valve such as 9. The reaction chamber is thus supplied only with pure hydrogen. The oxidation then follows as described in the above example.

The modalities of the gas phase etching and the epitaxial deposition are per se known. Accordingly, they need not be reiterated here. The gases specified above produce homogeneous oxide layers comparable to those produced using hydrogen.

Where the claims refer to $CO_2$ they are intended to encompass $CO_2$-containing materials such as specified above. Likewise, $H_2$ is intended to encompass $H_2$-containing materials as specified above.

We claim:

1. The method of producing homogeneous oxide layers on semiconductor crystals, particularly silicon semiconductor crystals, at elevated temperatures, which consists in oxidizing the semiconductor crystal with $CO_2$ in the presence of a hydrogen-containing compound selected from the group consisting of methane, ethylene, formaldehyde, dimethylether, ammonia, and hydrazine as a catalyst transported by a carrier gas during the oxidation.

2. The method of claim 1, wherein the oxidation is carried out in the same reactor immediately after a gas phase etching of the crystal surface.

3. The method of claim 1, wherein the oxidation is carried out immediately after an epitaxial precipitation.

4. The method of claim 1, wherein the oxidation is carried out immediately after a diffusion process.

References Cited

UNITED STATES PATENTS

| | | | |
|---|---|---|---|
| 2,930,722 | 3/1960 | Ligenza | 148—174 X |
| 3,258,359 | 6/1966 | Hugle | 117—213 |
| 3,331,716 | 7/1967 | Bloem et al. | 148—174 |

WILLIAM L. JARVIS, Primary Examiner

U.S. Cl. X.R.

117—201, 106, 118; 156—17